United States Patent

Alsup et al.

[15] 3,647,446

[45] Mar. 7, 1972

[54] PROCESS FOR PREPARING HIGH-RELIEF PRINTING PLATES

[72] Inventors: Michael J. Alsup, Rochester; Alfredo R. Guevara, Webster, both of N.Y.

[73] Assignee: Eastman Kodak Company, Rochester, N.Y.

[22] Filed: Mar. 5, 1970

[21] Appl. No.: 16,975

[52] U.S. Cl. ..............................96/35.1, 96/115 R, 96/36.3

[51] Int. Cl. ..............................G03c 1/68

[58] Field of Search ..............................96/35.1, 115, 36.3

[56] References Cited

UNITED STATES PATENTS

| | | | |
|---|---|---|---|
| 2,760,863 | 8/1956 | Plambeck | 96/115 X |
| 3,537,853 | 11/1970 | Wessells et al. | 96/115 X |
| 3,497,354 | 2/1970 | Steppan et al. | 96/115 |
| 3,250,615 | 5/1966 | Van Allen et al. | 96/115 X |
| 3,257,664 | 6/1966 | Leubner et al. | 96/115 |
| 3,556,793 | 1/1971 | Field et al. | 96/35.1 |
| 3,410,824 | 11/1968 | Atkinson | 96/115 X |

*Primary Examiner*—Ronald H. Smith
*Attorney*—W. H. J. Kline, J. R. Frederick and J. G. Levitt

[57] ABSTRACT

Polymeric relief images suitable for use in the production of stereotype printing plates are provided by imagewise exposing to actinic radiation a relatively thick photosensitive layer comprising a light-sensitive polymer capable of being efficiently sensitized and a sensitizing agent to insolubilize in depth the exposed areas of the photosensitive layer, after which a relief image can be developed by removing the unexposed areas of the layer.

19 Claims, No Drawings

PROCESS FOR PREPARING HIGH-RELIEF PRINTING PLATES

This invention relates to the preparation of polymeric relief images. In a particular aspect this invention relates to the production of high relief stereotype printing plates from relatively thick layers of photosensitive polymers.

Traditionally, stereotype letterpress printing plates have been produced from a lockup unit of printed matter composed of cast metal type, prepared by a machine such as the Monotype or Linotype. In the newspaper printing field, this unit of printed matter may represent one newspaper page. A paper intaglio matrix is produced from this unit by a pressure molding process and this paper matrix is in turn used to produce one or more cast lead stereotype printing plates which are curved to fit the rolls of a rotary printing press.

An innovation has been recently introduced which involves phototypesetting or photocomposition. In phototypesetting or photocomposition characters are produced by photographic techniques. For letterpress work, this photocomposed copy may then be used to produce photoengravings from which the paper matrices and lead stereotypes are made. The photoengravings can be prepared by coating a photoresist composition on a metal surface and exposing it to actinic radiation through the photocomposed copy to insolubilize the resist in an image pattern. The photoresist is then developed by removing the unexposed, soluble areas of the resist with suitable solvents. The metal plate bearing the resist image is then etched by acid to sufficient depth for letterpress printing. Printing plates are then made from such photoengraving by the Electrotype process, or by making a paper matrix or mat from the photoengraving, which in turn is used as a mold from which lead stereotype printing plates are formed. Such a process is both time consuming and expensive.

Alternatively, a method known as the "poly-autoplate process" has recently been developed. This process produces a plastic stereotype printing plate by flowing a liquid polyester resin over a paper mat that has been pulled from a zinc or a magnesium engraving. The polyester is then solidified by curing at 185° F. for a period of about 2½ minutes and is then ready for the press.

The poly-autoplates only need to be 20 to 30 mils thick. However, the metal engraving from which the paper mat is pulled requires about 35 minutes to prepare and this delay is a serious disadvantage. While such plastic printing plates are generally considered superior to lead stereotypes, the plastic plates require a rapid-access intaglio matrix from which the final plastic printing plate or plates may be cast. Such a matrix is commercially unavailable at the present time.

Accordingly, it is an object of this invention to provide a novel system for the production of polymeric relief images to be used in preparing high relief stereotype printing plates.

It is further object of this invention to provide a novel process for preparing polymeric relief images that requires only a short duration exposure.

Another object of the present invention is to provide a novel process for the production of high relief images which can be developed in a very short period of time.

Still another object of the present invention is to provide a novel relatively inexpensive printing plate having a high relief image which can be used either directly as a printing plate or as an intaglio matrix for casting lead or plastic stereotypes.

These and other objects of the present invention will become apparent to those skilled in the art from the further description of the invention which follows.

In accordance with the present invention, a polymeric relief image is provided by a process which comprises imagewise exposing to actinic radiation a support bearing a thick layer of a light-sensitive polymer which is capable of being efficiently sensitized and a sensitizing agent therefor, the exposure insolubilizing in depth the polymer in exposed areas of the layer. A relief image is developed by removing the noninsolubilized polymer from unexposed areas of the layer, typically by treatment with a solvent.

It has been found that by employing a sensitized layer of a light-sensitive polymer which is capable of being efficiently sensitized a relatively high relief image can be produced in a relatively short period of time.

According to one embodiment of the present invention, the exposed cross-linked polymeric layer is developed in a particularly short period of time by employing ultrasonic agitation during the solvent development of the element.

Any light-sensitive polymer which is capable of being efficiently sensitized can be employed in preparing the photosensitive layers of the present invention. The term "light-sensitive polymer capable of being efficiently sensitized" as employed herein is intended to include those light-sensitive polymers which, when sensitized, can be insolubilized in depth with relatively short exposures to actinic radiation. Light-sensitive polymers having the desired properties for use in the present invention include light-sensitive polymers having unsaturated cyclic groups appended to a polymer backbone as the light-sensitive moiety.

A preferred group of such polymers includes those described in DeBoer U.S. Pat. application Ser. No. 831,242, filed June 6, 1969, in which the unsaturated cyclic groups are three to six membered carbocyclic rings containing an ethylenic double bond. These efficiently sensitzable, light-sensitive polymers may be prepared by condensing a carboxylic acid derivative of the unsaturated cyclic group with a preformed polymer backbone containing groups reactive therewith, such as hydroxy groups and amino groups. The unsaturated cyclic group may be joined to the polymer backbone through a carbonyl group, for example, through a carbonyloxy linkage, an oxycarbonyl linkage or an amido linkage.

The cyclic groups which are contained in the highly sensitizable polymers employed in the present invention and which are described in the above-mentioned Serial No. 831,242 include derivatives of such unsaturated three to six membered carbocyclic compounds as aryl and diarylcyclopropenes, alkyl and dialkylcyclo-propenes, aryl and diarylcyclobutenes, alkyl and dialkylcyclo-butenes, aryl and diarylcyclopentenes, alkyl and dialkylcyclo-pentenes, aryl and diarylcyclohexenes, alkyl and dialkylcyclohexenes, and the like.

The polymers which form the backbone of the polymers and to which light-sensitive moieties are appended include natural and synthetic resins such as free hydroxyl containing polymers, for example, poly(vinyl alcohol), poly(vinyl alcohol-co-vinyl acetate), poly(vinyl alcohol-co-vinyl benzoate), poly(vinyl alcohol-co-vinyl acetate-co-vinyl benzoate), polyethers such as epoxy and and phenoxy polymers, e.g., the condensation product of diphenylolpropane with epichlorohydrin, thermoplastic phenolic resins such as novolac resins, e.g., phenol formaldehyde and cresol formaldehyde novolac resins; naturally occurring material such as cellulose, starch, guar, alginic acid, and their partially esterified or etherified derivatives, polyesters of polyhydroxy intermediates such as glycerol and sorbitol which have free hydroxyl groups remaining after incorporation in the polymer chain; polymers containing reactive amino groups such as aminostyrene, and anthranilic acid polymers such as poly(vinyl anthranilate).

The light-sensitive polymers utilized in the present invention have repeating units which can be depicted by the following structural formula:

I

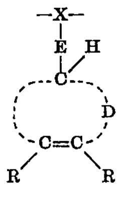

where X represents a polymer backbone; E is a linkage such as a carbonyloxy linkage, an oxycarbonyl linkage, an amido linkage, and the like; D represents the nonmetallic atoms necessary to complete a three to six membered carbocyclic ring such as a cyclopropene ring, a cyclobutene ring, a cyclopentene ring or a cyclohexene ring; and each R is a hydrogen atom, an alkyl group of 1 to 12 carbon atoms (e.g., methyl, ethyl, propyl, butyl, amyl, hexyl, nonyl, decyl, dodecyl, etc.), or an aryl group having one or two rings, such as a phenyl or a naphthyl group which is unsubstituted or substituted with one or more of such groups as hydroxy groups, halogen groups (e.g., chloro and bromo groups), carbonyl groups, cyano groups, alkyl groups of one to 12 carbon atoms, alkoxy groups of one to 12 carbon atoms, and the like.

An especially preferred group of efficiently sensitizable light-sensitive polymers for use in the present invention and described in the above-mentioned DeBoer U.S. Pat. application Ser. No. 831,242 are those which are obtained by esterifying a hydroxyl containing polymer with a 1,2-diarylcyclopropene-3-carbonyl chloride and which contain repeating units represented by the following structural formula:

II

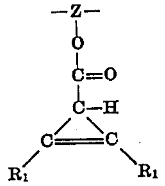

wherein Z represents the polymeric residue of a hydroxyl containing polymer; and each $R_1$ is an aryl group such as a phenyl group, a substituted phenyl group, a naphthyl group, a substituted naphthyl group, etc.

In addition to the light-sensitive group, the polymer may contain other non-light-sensitive groups attached to the polymer backbone. Such other groups are often useful in modifying such physical properties of the polymer as solubility, adhesivity, melting point, and the like. Useful groups include those derived from aliphatic and aromatic carboxylic acids, such as acetic acid, haloacetic acids, propionic acid, succinic acid, glutaric acid, adipic acid, sebacic acid, decanoic acid, benzoic acid, halobenzoic acids, nitrobenzoic acids, toluic acids, p-ethylbenzoic acid, p-octylbenzoic acid, p-ethoxybenzoic acid, p-amyloxybenzoic acid, 2-naphthoic acid, and the like. These groups can comprise up to 90 mole percent of the groups attached to the polymer backbone. Thus, polymers may contain as little as 10 mole percent of the light-sensitive group attached to the polymer backbone and preferably contain about from 10 to 85 mole percent of the light-sensitive group.

These additional modifying groups may be represented by repeating units having the structural formula:

III

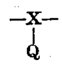

and in particular by the structural formula:

IV

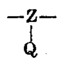

wherein X and Z are as defined above and Q represents the residue of an aliphatic or aromatic carboxylic acid, referred to above, when reacted with a hydroxyl or amino containing polymer.

This group of light-sensitive polymers may be prepared by reacting a polymer containing a free hydroxyl or amine group with a carboxylic acid chloride of an appropriate light-sensitive unsaturated cyclic compound. A highly useful procedure for preparing light-sensitive polymers is described in copending Reynolds U.S. Pat. application Ser. No. 812,380, entitled "A Process for the Preparation of Soluble Polyvinyl Esters," filed Apr. 1, 1969, now U.S. Pat. No. 3,504,395. This procedure involves swelling a hydroxyl containing polymer in pyridine followed by partial esterification with an aroyl chloride such as benzoyl chloride. The light-sensitive acid chloride is then reacted with the mixture and finally the esterification of any remaining hydroxyl groups is completed with benzoyl chloride. Acetone or dimethylformamide is then added, insoluble materials are filtered off and the polymer is precipitated by drawing the solution through a water aspirator. The polymer is then leached in running water and air dried.

The light-sensitive acid chlorides used to prepare polymers employed in the present invention may be prepared by procedures known to those skilled in the art. For example, 1,2-diphenylcyclo-propene-3-carboxylic acid can be prepared by the procedure of Breslow et al., J. Org. Chem., Vol. 24 (1959), page 415, which involves the dropwise addition of ethyldiazoacetate to a stirred melt of diphenylacetylene at 130° C. containing 1–2 percent copper dust, followed by basic hydrolysis of the reaction mixture, extraction of the unreacted diphenylacetylene with cyclohexane and acidification to precipitate the product.

Another preferred group of light-sensitive polymers for use in the present invention which can be efficiently sensitized are polymers described in Reynolds et al. U.S. Pat. application Ser. No. 3,536, filed Jan. 16, 1970, for "Light-Sensitive Polymers" which contain, as the light-sensitive moiety, a side chain containing two ethylenically unsaturated groups conjugated to each other through an arylene group. These light-sensitive polymers can be prepared by reacting a suitable compound containing the light-sensitive moiety with an appropriate polymer backbone. The compound containing the light-sensitive moiety should have one group which is reactive with a group on the polymer backbone and through which it can be attached to the polymer backbone. If the compound containing the light-sensitive moiety has more than one such group, the polymer backbone is likely to be cross-linked during the preparation thus destroying its utility in photosensitive compositions. Thus, one of the ethylenically unsaturated groups is attached to the polymer backbone through the residue of a group which is reactive with a group on the polymer backbone and the other of the ethylenically unsaturated groups is terminated with groups which are nonreactive with the groups on the polymer backbone. Typically, the light-sensitive polymers can be prepared by condensing a carboxylic acid or carboxylic acid halide containing the light-sensitive moiety with a preformed polymer containing groups reactive therewith, such as free reactive amino groups or hydroxyl groups, in which case the light-sensitive moiety is attached to the polymer backbone through an amido linkage or a carbonyloxy linkage. Another procedure for preparing light-sensitive polymers of this invention involves reacting a hydroxyl-containing derivative of the light-sensitive moiety with a polymer containing groups reactive therewith, such as free reactive anhydride groups, carboxylic acid groups or carboxylic acid halide groups, in which case the light-sensitive moiety is attached to the polymer backbone through an oxycarbonyl linkage.

Light-sensitive side chains which are appended to the polymer backbone to form the polymers of this invention can be represented by the formula:

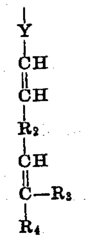

wherein Y is an oxycarbonyl linkage, a carbonyloxy linkage, an amido linkage, and the like; $R_2$ is an arylene group such as a mono or polynuclear arylene group of the benzene series, e.g., phenylene, naphthylene, biphenylene, chlorophenylene, nitrophenylene, etc., or a five- or six-membered heterocyclic arylene group containing such hetero atoms as oxygen, sulfur, nitrogen, etc., pyridylene, furylene, thiofurylene, thienylene, 1-alkyl-2-pyrrolylene, etc., preferably $R_2$ is a phenylene group. $R_3$ and $R_4$ are so selected that they will not react with groups on the polymer backbone to which the light-sensitive moiety is attached. Thus, where the compound containing the light-sensitive moiety is bifunctional, such as a dicarboxylic acid, one of the functional groups is blocked so as to prevent cross-linking of the polymer backbone. Thus, $R_3$ is hydrogen, cyano, alkyl generally having one to 10 carbon atoms, e.g., methyl, ethyl, propyl, isopropyl, butyl, sec-butyl, t-butyl, n-amyl, neopentyl, n-hexyl, n-heptyl, n-octyl, 2-ethylhexyl, etc., alkenyl generally having two to six carbon atoms, e.g., vinyl, allyl, etc., and the like; and $R_4$ is hydrogen, nitro or a monovalent organic group non-reactive with the groups on the polymer backbone, such as alkyl generally having one to 10 carbon atoms, alkenyl generally having two to six carbon atoms, aryl, e.g., phenyl, naphthyl, biphenyl, furyl, pyridyl, etc., alkoxy generally having one to 10 carbon atoms, e.g., methoxy, ethoxy, propoxy, butoxy, amyloxy, hexyloxy, heptyloxy, etc., aryloxy, e.g., phenoxy, furyloxy, etc., alkylcarbonyl generally having two to 11 carbon atoms, e.g., methylcarbonyl, ethylcarbonyl, propylcarbonyl, butylcarbonyl, amylcarbonyl, hexylcarbonyl, octylcarbonyl, 2-ethylhexylcarbonyl, etc., arylcarbonyl, e.g., benzoyl, naphthoyl, etc., alkoxycarbonyl generally having two to 11 carbon atoms, e.g., methoxycarbonyl, ethoxycarbonyl, propoxycarbonyl, butoxycarbonyl, amyloxycarbonyl, hexyloxycarbonyl, heptyloxycarbonyl, octyloxycarbonyl, nonyloxycarbonyl, etc., alkenyloxycarbonyl generally having three to seven carbon atoms, e.g., allyloxycarbonyl, methacryloylcarbonyl, etc., aryloxycarbonyl, e.g., phenoxycarbonyl, and the like, said aryloxycarbonyl, arylcarbonyl, aryloxy, and aryl groups being optionally substituted, particularly in the para-position, with such groups as nitro, azido, alkyl generally having one to 10 carbon atoms, alkoxy generally having one to 10 carbon atoms, dialkylamino, diarylamino and the like groups.

Representative reactants which can be employed to attach the light-sensitive side chain to the polymer include:

p-vinylcinnamoyl chlorides such as
p-vinylcinnamoyl chloride,
p-(2-nitrovinyl)cinnamoyl chloride,
p-(2-propylvinyl)cinnamoyl chloride,
p-(2-phenylvinyl)cinnamoyl chloride,
p-[2-(p-nitrophenyl)vinyl]cinnamoyl chloride,
p-(2,2-diethylvinyl)cinnamoyl chloride,
p-(2-amyloxyvinyl)cinnamoyl chloride,
p-(2-ethoxyvinyl)cinnamoyl chloride,
p-[2-(2-ethylhexyloxy)vinyl]cinnamoyl chloride,
p-(2-propoxy-2-cyanovinyl)cinnamoyl chloride,
p-(2-naphthoxyvinyl)cinnamoyl chloride,
p-(2-methylcarbonylvinyl)cinnamoyl chloride,
p-(2-ethylcarbonylvinyl)cinnamoyl chloride,
p-(2-ethyl-2-benzoylvinyl)cinnamoyl chloride,
p-[2-butyl-2-(p-methoxybenzoyl)vinyl]cinnamoyl chloride,
p-(2-ethoxycarbonylvinyl)cinnamoyl chloride,
p-[2-(2-ethylhexyloxycarbonyl)vinyl]cinnamoyl chloride,
p-(2-hexyloxycarbonylvinyl)cinnamoyl chloride,
p-(2-ethyl-2-ethoxycarbonylvinyl)cinnamoyl chloride,
p-(2-vinyl-2-ethoxycarbonylvinyl)cinnamoyl chloride,
p-(2-allyl-2-propoxycarbonylvinyl)cinnamoyl chloride,
p-(2-ethoxycarbonyl-2-cyanovinyl)cinnamoyl chloride,
p-[2-(2-ethylhexyloxycarbonyl)-2-cyanovinyl]cinnamoyl chloride,
p-(2-allyloxycarbonylvinyl)cinnamoyl chloride,
p-(2-vinyl-2-allyloxycarbonylvinyl)cinnamoyl chloride,
p-(2-phenoxycarbonylvinyl)cinnamoyl chloride, etc.; and
4-vinylchalcones such as
4-(2-chlorocarbonylvinyl)chalcone,
4-(2-chlorocarbonylvinyl)-4'-methoxychalcone,
4-(2-chlorocarbonylvinyl)-4'-amyloxychalcone,
4-(2-chlorocarbonylvinyl)-4'-(2-ethylhexyloxy)chalcone,
4-(2-chlorocarbonylvinyl)-4'-propylchalcone,
4-(2-chlorocarbonylvinyl)-4'-octylchalcone,
4-(2-chlorocarbonylvinyl)-4'-dimethylaminochalcone,
4-(2-ethoxycarbonylvinyl)-4'-(2-hydroxyethoxy)chalcone, etc.;

as well as such reactants as 2-styryl-5-(2-chlorocarbonylvinyl)furan,
2-(2-amyloxyvinyl)-5-(2-chlorocarbonylvinyl)furan,
2-[2-(p-methoxyphenyl)vinyl]-5-(2-chlorocarbonylvinyl)furan,
2-[2-(2-ethylhexyl)vinyl]-5-(2-chlorocarbonylvinyl)thiofuran,
2-(2-ethoxycarbonylvinyl)-6-(2-chlorocarbonylvinyl)pyridine, and the like.

The light-sensitive moieties may be appended to a backbone comprising natural and synthetic resins such as hydroxyl containing polymers, for example, poly(vinyl alcohol), partially hydrolyzed poly(vinyl esters) such as poly(vinyl alcohol-co-vinyl acetate), poly(vinyl alcohol-co-vinyl benzoate), poly(vinyl alcohol-co-vinyl acetate-co-vinyl benzoate), partially hydrolyzed poly(vinyl acetals) such as partially hydrolyzed poly(vinyl butyral), partially hydrolyzed poly(vinyl benzal), partially hydrolyzed poly(vinyl cinnamal) as well as mixtures of such partially hydrolyzed acetals, polyethers such as epoxy and phenoxy polymers, e.g., the condensation product of a bisphenol, such as diphenylolpropane, with epichlorohydrin, naturally occuring materials such as cellulose, starch, guar, alginic acid, and their partially esterified or etherified derivatives, e.g., ethyl cellulose, hydroxyethyl cellulose, hydroxypropyl cellulose, polyesters of polyhydroxy intermediates such as glycerol and sorbitol which have hydroxyl groups remaining after incorporation in the polymer chain, etc.; polymers containing reactive amino groups, for example, poly(vinyl amines), aminostyrenes, poly(vinyl anthranilates), etc., and polymers containing reactive anhydride groups, for example, copolymers of maleic anhydride with ethylene or styrene.

As previously mentioned, the light-sensitive polymers employed in the present invention can be prepared by reaction of the hydroxy or amino group on the polymer backbone with an acyl halide of the light-sensitive moiety or by reaction of a hydroxy containing derivative of the light-sensitive moiety with a polymer containing reactive anhydride, carboxylic acid or carboxylic acid halide groups. This reaction may be carried out, for example, in a tertiary amine solvent such as pyridine, picoline, lutidine, triethylamine, and the like, at room temperature, or at elevated temperatures up to about 100° C.

In addition to the groups containing the light-sensitive moiety, the polymers may have attached to the polymer backbone groups that are derived from other carboxylic and dicarboxylic acids. Such other groups are often used in modifying such physical properties of the polymer as solubility, adhesivity, melting point, ink receptivity, resistance to chemical etchants, and the like, and in some instances can modify the sensitometric properties of the polymer as well. Useful groups include those derived from aliphatic and aromatic carboxylic acid, such as acetic acid, haloacetic acid, propionic acid, butyric acid, isovaleric acid, succinic acid, glutaric acid, adipic acid, sebacic acid, 2-ethylhexanoic acid, decanoic acid, benzoic acid, halobenzoic acids, nitrobenzoic acids, toluic acids, p-ethylbenzoic acid, p-octyl-benzoic acid, p-methoxybenzoic acid, p-ethoxybenzoic acid, p-amyloxy-benzoic acid, p-lauryloxybenzoic acid, 2-naphthoic acid, and the like, as well as those derived from carboxylic and dicarboxylic acids which themselves give light-sensitive polymers, for example, acids containing the vinyl ketone group such as cinnamic acid, halocinnamic acids, cinnamylidene acetic acid, cinnamylidene malonic acid, and the like. These modifying side chains can be introduced into the polymer by reacting it with an acyl halide of the modifying group, and it can be attached to the polymer prior to addition of the light-sensitive group, for example, when an acetylated poly(vinyl alcohol) is used as the polymer backbone, or when the procedure of the Reynolds U.S. application Ser. No. 812,380, referred to above, is employed to prepare the light-sensitive polymers of this invention. Alternatively, free reactive groups, which are contained on the polymer backbone after addition of the light-sensitive moiety, can be reacted with an acyl halide, or other suitable reactant, of these modifying groups. The modifying side chains can comprise up to 95 percent of the groups attached to the polymer backbone. Thus, as few as 5 percent of the groups attached to the polymer backbone can be light-sensitive groups of the present invention. In general, it is preferred that 5 to 50 percent of the groups attached to the polymer backbone are light-sensitive groups of this invention, although this will vary depending upon the nature of the polymer forming the backbone, its molecular weight, and similar factors. Thus, for example, when a low molecular weight poly(vinyl alcohol) is employed as the polymer backbone preferably 20 to 100 mole percent of the groups attached to the polymer backbone are light-sensitive groups; when a medium molecular weight poly(vinyl alcohol) is employed 10 to 60 mole percent of the groups attached to the polymer backbone are preferably light-sensitive; and with a high molecular weight poly(vinyl alcohol) it is preferred that 5 to 50 mole percent of the groups attached to the polymer backbone be light-sensitive groups.

As previously mentioned, the sensitizing agent of the present invention must be capable of rendering the polymer insoluble in depth upon exposure to actinic radiation.

Suitable sensitizers for this purpose include, for example, pyrylium and thiapyrylium salts [e.g., 2,6-bis(p-ethoxy-phenyl)-4-(p-amyloxyphenyl)thiapyrylium perchlorate], thiazoles, benzothiazolines, naphthothiazolines (e.g., 2-benzoylmethylene-3-ethylnaphtho-[1,2-d]-thiazoline), quinolizone, Michler's ketone, Michler's thioketone, benzophenone, furanones, anthraquinones, 2,6-bis-p-azidobenzal-4-methylcyclohexanone and the like sensitizers. Pyrylium and thiapyrylium salts are especially preferred sensitizers for the purposes of the present invention. Such salts include, for example:

2,4,6-triphenylpyrylium perchlorate,
4-(4-methoxyphenyl)-2,6-diphenylpyrylium perchlorate,
4-(2,4-dichlorophenyl)-2,6-diphenylpyrylium perchlorate,
4-(3,4-dichlorophenyl)-2,6-diphenylpyrylium perchlorate,
2,6-bis(4-methoxyphenyl)-4-phenylpyrylium perchlorate,
6-(4-methoxyphenyl)-2,4-diphenylpyrylium perchlorate,
2-(3,4-dichlorophenyl)-4-(4-methoxyphenyl)-6-phenylpyrylium perchlorate,
4-(4-amyloxyphenyl)-2,6-bis(4-ethylphenyl)pyrylium perchlorate.

Suitable pyrylium and thiapyrylium salts in addition to the foregoing are disclosed in U.S. Pat. No. 3,250,615 to VanAllan et al., which is hereby incorporated by reference. Suitable concentrations of the sensitizer include between about 0.005 and about 5 weight percent of the polymer, preferably between about 0.005 and about 0.1 weight percent.

Coating compositions for use in this invention can be prepared by dispersing or dissolving the polymer and the sensitizing agent in an organic solvent such as aromatic solvents, for example, benzene, xylene, toluene, benzyl alcohol, etc.; alkanols, such as ethanol, isopropanol, 2-methoxyethanol, etc.; ketones such as acetone, 2-butanone, 4-methyl-2-pentanone, cyclohexanone, etc.; chlorinated hydrocarbon solvents such as chloroform, carbon tetrachloride, trichloroethylene, dichloroethane, trichloroethane, tetrachloroethane, etc.; dimethylformamide; mixtures of these solvents, and the like. A preferred solvent is ethylene chloride.

A variety of addenda can be incorporated in the coating compositions. These include agents to modify physical properties of the coating such as flexibility, adhesivity, surface characteristics, as well as antioxidants, preservatives, and the like. Nonlight-sensitive polymers can also be added to the coating compositions to serve as diluents or extenders. Solid particles, such as glass microbead having an average diameter of 1 to 10 $\mu$, are preferred as extenders since they increase the bulk and porosity of the coating without absorbing incident radiation.

According to another aspect of the invention, the sensitized light-sensitive polymer may be coated from a melt or a solution of the polymer and a suitable plasticizer. This gives greater flexibility and increased solvent developability to the coating without a prohibitively great loss in photographic speed. Suitable plasticizers include chlorinated biphenyls, ethylenedicinnamate, 1,3-trimethylenedicinnamate, chlorinated terphenyls, 1,4-tetramethylenedicinnamte, etc. The plasticizer can comprise as much as 70 percent by weight of the melt and preferably constitutes 30 to 40 weight percent.

Photosensitive elements can be prepared by coating the present sensitized compositions from a melt or by solvent evaporation onto supports in accordance with usual practices. Depending upon the particular application contemplated, suitable polyethylene-coated paper, polypropylene-coated paper, parchment, cloth, etc.; sheets and foils of such metals as aluminum, copper, magnesium, zinc, etc.; glass and glass coated with such metals as chromium, chromium alloys, steel, silver, gold, platinum, etc.; synthetic polymeric materials such as polyalkyl methacrylates [e.g., polymethylmethacrylate)], polyester film base [e.g., poly(ethylene terephthalate)], polyvinyl acetals, polyamides (e.g., nylon), cellulose ester film base (e.g., cellulose nitrate, cellulose acetate, cellulose acetate propionate, cellulose acetate butyrate), and the like. Thus, for example, sheet aluminum is a highly desirable support in the preparation of a printing plate.

As previously mentioned, the light-sensitive coating composition of the present invention is insolubilized in depth, and can be employed to produce high relief images. Accordingly, relatively thick coatings are preferably employed in the present invention, and typical coating thicknesses can be between about 0.1 and about 50 mils, preferably between about 15 and about 30 mils.

In order to assure that the letterpress plate has optimum structural rigidity and high strength, the height of the relief image should be greater for widely spaced images than for closely spaced images on the same plate. In the case of halftone dot patterns, the relief height must be relatively small. When the larger type sizes, are employed, for which the spacing between image edges is large, the maximum relief height obtainable with the plate should be utilized. Relief plates which do not preserve this relationship between relief height and the distance between image edges tend to have a reduced structural rigidity.

Structural rigidity can be improved by arranging conditions during exposure to undercut the nonimage areas of the plate so that in a cross section through two halftone dots the crosslinked polymer looks like a U-shaped well from which the uncrosslinked material has been removed. This both improves the rigidity of the plate and reduces solvent development problems by eliminating the need for removing material which is usually difficult to remove. This undercutting can be accomplished in several ways. One way is to use an extremely diffuse light source. Another is to disperse in the coating composition particles which scatter, but do not absorb, the exposing radiation. The most efficient use of the scattered portion of the exposing radiation is obtained when there is a concentration gradient of the sensitizing dye through the depth of the light-sensitive layer; the lowest concentration of dye being at the surface of the layer and the greatest concentration being adjacent the support. One method of obtaining such a concentration gradient is by the use of "stepped" dye layers, wherein there is sequentially coated, or placed on the support, layers of light-sensitive compositions having progressively lower concentrations of sensitizing dye.

Any suitable light source may be employed for exposing the photosensitive polymeric coatings of the present invention. Such sources include those which are rich in visible radiation and sources rich in ultraviolet radiation, such as carbon arc lamps, mercury vapor lamps, fluorescent lamps, tungsten lamps, photoflood lamps, and the like. Exposure times will vary depending upon the nature of the source, the polymeric coating and other factors. This may be easily determined for each case.

The exposed photosensitive layer of the present invention may be developed by treating such layers with a solvent for the unexposed, uncrosslinked polymer which is a nonsolvent for the exposed, hardened polymer. Suitable solvents include those mentioned in the above as being suitable in the preparation of the coatings. However, preferred solvents include 1,1,1-trichloroethane, benzyl alcohol, ethylene dichloride and the like.

As previously mentioned, one aspect of the present invention involves the solvent development of the present photosensitive layers, while being subjected to ultrasonic agitation.

Thus, for example, development of the exposed photosensitive layer may be conducted in a solvent, such as 1,1,1-trichloroethane, contained in an ultrasonic transducer tank. By employing ultrasonic agitation, the time required for the solvent development is significantly reduced. Suitable ultrasonic agitation baths are commercially available. Good results are obtained at frequencies in the range of 20 to 100 kilocycles. Frequencies of 20 to 25 kilocycles are especially preferred. Accordingly, a high relief image of excellent quality can be produced by immersing the exposed photosensitive layer in an ultrasonically agitated bath for as little as 4 minutes. While the residence time employed for solvent development will vary, typical times are between about 1 and about 10 minutes. Suitable solvent development temperatures, depending on the solvent used, include between about 20° and about 100° C., preferably between about 20° and about 60° C.

The relief images produced according to the present invention provide a printing plate containing a high relief negative image of the original transparency and may be used either directly as an image-bearing printing plate or as an intaglio matrix for casting lead or plastic stereotype which would constitute a positive image of the original transparency.

The following examples illustrate the present invention. The percentages are by weight, unless otherwise specified.

EXAMPLE 1

A light-sensitive polymer for use in the present photosensitive elements is prepared as follows:

One and one-third grams of a medium molecular weight polyvinyl alcohol containing 12 percent acetate groups (Elvanol 52–22 sold by E. I. DuPont Company) are swollen in 20 milliliters of dry pyridine at 90° C. for 1 hour. Next, 0.5 milliliter of benzoyl chloride is added with stirring, and the mixture is stirred for 1 hour. Under safelight conditions, 1.0 gram of 1,2-diphenyl-cyclopropene-3-carboxylic acid chloride is added with stirring and the mixture is stirred in the dark for 1 hour. Once the light-sensitive acid chloride is added, all operations are performed under safelight conditions or in the dark. At the end of this time, the solution is homogeneous, clear, transparent and viscous. Next, 0.8 milliliter of benzoyl chloride is added, the mixture is stirred for 1 hour and then held at 50° C. for 1 hour without stirring. After this, 15 milliliters of acetonitrile are added and the polymer is precipitated into 1,500 milliliters of water with stirring. The polymer is collected and pressed dry. It is then dried in a vacuum oven at 60° C. and $10^{-1}$ torr pressure for 1 hour. The polymer is dissolved in 100 milliliters of acetone, precipitated into 1 liter of water, collected and dried in a vacuum oven for 12 hours at 50° C. and a pressure of 11 torr. The product obtained is a white, friable, light-sensitive polymer containing 26 mole percent 1,2-diphenylcyclopropene-3-carboxylate groups.

EXAMPLE 2

Another polymer which can be used in the present invention can be prepared as follows:

Twenty-five grams (0.088 equivalents) of a polyether prepared by condensation of 2,2-bis(p-hydroxyphenyl)propane with epichlorohydrin (sold by Union Carbide, Phenoxy PRDA Resin) are dissolved in 800 milliliters of a 50:50 pyridine:dichloroethane mixture. To this solution are added 31 grams (0.089 equivalents) of p-[2-(2-ethylhexyloxycarbonyl)vinyl]cinnamoyl chloride and the mixture is heated at 50° C. in total darkness with occasional shaking for 4 hours. The cooled solution is then slowly poured into 4 liters of a 98 percent methanol solution. The polymer is leached in 98 percent methanol and then in anhydrous methanol, and finally is dried over phosphoric anhydride at reduced pressure. All of the above isolation steps are done in the absence of white light. There is obtained 45 grams of light-sensitive poly{{2-{p-[2-(2-ethylhexyl-oxycarbonyl)vinyl]cinnamoyloxy} trimethylene-2,2-bis(4-oxyphenyl)-propane}}.

The following examples illustrate the preparation and use of photosensitive elements in accordance with the present invention.

EXAMPLE 3

One gram of a polyvinyl (12 percent acetate, 58 percent benzoate, 30 percent diphenylcyclopropene carboxylate) prepared as described in Example 1 is dissolved in 30 grams of ethylene dichloride. Two grams of glass microbeads having an average diameter of 2.0 $\mu$ and 0.005 gram of 2,6-bis-p-ethoxyphenyl-4-p-n-amyloxyphenyl thiapyrylium perchlorate are added to the solution. The resultant dope is coated onto an anodized aluminum support at a total dry thickness of 5 mils. The dried element is imagewise exposed through its face to a pulsed Xenon arc lamp for a period of thiry seconds. The coating is then developed by lightly swabbing with benzyl alcohol. A 5 mil relief image is obtained.

EXAMPLE 4

A 20 mil thick coating on 4-mil subbed poly(ethylene terephthalate) is prepared as in Example 3 with the microbeads omitted and the concentration of the thiapyrylium salt sensitizer is reduced to 0.1 percent based upon the dry weight of the polymer. The coating is imagewise exposed through the base for a period of 60 seconds to a 500 watt tungsten source and is developed by swabbing for a period of 8 to 10 minutes in benzyl alcohol. A 20 mil relief image is obtained.

EXAMPLE 5

The procedure of Example 4 is repeated with the exception that the coating has a 5.5 mil dry thickness and the exposure is reduced to 20 seconds through the base to a 500 watt tungsten source. A 5.5 mil relief image is obtained.

EXAMPLE 6

The procedure of Example 5 is repeated with the exception that the sensitizer concentration is increased to 1 percent based upon the weight of the polymer. A 6.0 mil layer yields a 2.5 to 3.0 mil relief image with a 20 second exposure to the 500 mil tungsten lamp.

EXAMPLE 7

The procedure of Example 6 is repeated with the exception that the sensitizer concentration is increased to 5 percent based upon the weight of the polymer. A 5.0 mil layer yields a 1.5 mil relief image with a 20 second exposure to the 500 watt tungsten lamp.

EXAMPLE 8

A photopolymer layer consisting of polyvinyl (12 mol percent acetate, 58 mol percent benzoate and 30 mol percent 1,2-diphenylcyclopropene-3-carboxylate) and containing 0.1 percent of the thiapyrylium salt used in Example 3 based upon the weight of the photopolymer is coated onto a support at a dry thickness of 20 mils. The dry polymer matrix is exposed through a line negative and is developed with a mixture of benzyl alcohol and water to remove the nonexposed, uncrosslinked polymer. An exposure in the range of 30 to 60 seconds to a tungsten 500 watt source is sufficient to completely insolubilize the photopolymer throughout the 20 mil layer. A good relief image is obtained.

EXAMPLE 9

A 15 weight percent solution of poly{{2-{p-[-(2-ethyl-hexyloxycarbonyl)vinyl]cinnamoyloxy}trimethylene-2,2-bis(4-oxy-phenyl)propane}},prepared as described in Example 2, in ethylene chloride containing 0.05 percent by weight of the sensitizer 2,6-bis-p-ethoxyphenyl-4-p-n-amyloxyphenyl thiapyrylium perchlorate is coated at a dry thickness of 21 mil by pouring the dope onto a grained sheet aluminum support and drying for several hours at 10°–15° C. The plate is exposed through a high-density line transparency to a 4,000 watt Xenon source at a distance of 15 inches for 6 minutes. Development is then carried out in 1,1,1-trichloroethane (referred to herein as "TCE") at 50° C. in a 25 kilocycle ultrasonic transducer tank containing 2 liters of the solvent. At the end of four minutes of development, a high relief image of excellent quality is obtained. The plate is thoroughly dry after 2 minutes in a 60° C. ventilated oven. The plate is flexible and tough and the sides of the letters are shown by microscopy to be clean and very nearly perpendicular to the support.

EXAMPLE 10

A 20 mil thick coating is prepared as described in Example 9 except that 0.05 percent by weight of 2-benzoylmethylene-3-ethyl-naphtho[1,2-d]thiazoline is used as the sensitizer and is exposed for 6 minutes to the Xenon source and developed in ultrasonically agitated TCE for eight minutes at 27° C. This results in a high relief image of good quality which can be attached to a flat bed letterpress proofing press and used to produce proofs of good quality without damage to the plate.

EXAMPLE 11

A 15 percent solution of poly[4,4′-isopropylidenediphenyl 2-(1,2-diphenylcyclopropenyl-3-carbonyloxy)trimethylene ether] in ethylene chloride containing 0.05 percent by weight of the thiapyrylium dye is coated as in Example 8 to a dry thickness of 20 mil and is exposed to the Xenon source for 6 minutes. The same is developed in ultrasonically agitated TCE for 8 minutes at 35° C., yielding a high relief image of good quality.

EXAMPLE 12

A light-sensitive polymer of the type used in Example 11 is plasticized with a chlorinated biphenyl plasticizer (Arochlor 1254 sold by Monsanto Company) at a weight ratio of 1 part plasticizer to 1 part polymer. The solvent is removed by evaporation first on a hotplate and then overnight in a 100° C. oven. The glass transition temperature (Tg) of the light-sensitive polymer is 92° C. and the Tg of the plasticized material is 9° C. The initial thermomechanical softening points of these materials are 99° C. for the unplasticized material, and 14° C. for the plasticized material. A five mil coating is prepared from this unsensitized material and a relief image is obtained with a 7.5 minute exposure. The coating is then developed with ultrasonically agitate TCE.

The following examples illustrate the preparation of elements with "stepped" dye layers and the incorporation of a scattering agent in a photosensitive element of this invention prepared with such "stepped" dye layers.

EXAMPLE 13

A 15 percent by weight solution of the polymer used in Example 9 is prepared using ethylene chloride as the solvent. After the polymer is dissolved, the plasticizer used in Example 12 is added to the solution in an amount equal to 60 percent by weight based on the weight of the polymer. The solution is thoroughly mixed and divided into 6 equal parts. The solutions are then sensitized with the thiapyrylium dye used in Example 9 at 0.01, 0.02, 0.03, 0.04, 0.05 and 0.06 percent relative to polymer weight. Each of the dopes are then coated on an unsubbed poly(ethylene terephthalate) support at a 0.024 inch wet thickness. The resulting coatings are heat transferred, in order of decreasing sensitizer concentration, to a grained aluminum support. A typical coating thickness is 0.021 inch. The lowest concentration of sensitizer is at the top of the plate, so that there is an increase in absorptivity as exposing energy passes from the top to the bottom of the plate. This results in an increase in the efficiency of utilization of actinic energy. The plate is exposed through test originals containing both line copy and a 150 line halftone screen pattern containing a dot series from 5 percent to 95 percent, and is developed ultrasonically as described in Example 9. Side view photomicrographs of the resulting relief images show that the desired dependence of relief height on the distance between image edges is obtained. An excellent relief image of the halftone pattern original is obtained.

EXAMPLE 14

Six plasticized photopolymer solutions, sensitized at six dye concentration levels, as described in Example 13, are prepared. Barium sulfate is added as a scattering agent to each solution in an amount equal to 15 percent by weight based on the weight of the photopolymer. A plate is then prepared, exposed and processed as described in Example 13. Side view photomicrographs of the resulting relief image show that the effect of the dye concentration gradient is enhanced by the addition of the scattering agent.

The invention has been described in detail with particular reference to preferred embodiments thereof, but it will be understood that variations and modifications can be effected within the spirit and scope of the invention.

What is claimed is:

1. A method for production of a polymeric relief image, which comprises imagewise exposing to actinic radiation a support bearing a layer having a thickness of 5 to 50 mils of a light-sensitive polymer having appended to the polymer backbone a light-sensitive moiety which is selected from the group consisting of a three to six membered carbocyclic ring containing an ethylenic double bond and a side chain containing two ethylenically unsaturated groups conjugated to each other through an arylene group and a sensitizing agent therefor present in an amount of between about 0.005 and 0.1 percent by weight based on the weight of the polymer to insolubilize in depth the polymer in exposed areas of the layer, and developing a relief image by removing noninsolubilized polymer from unexposed areas of the layer with a solvent therefor which is a non solvent for polymer in the exposed areas of the layer.

2. The method of claim 1 wherein the polymer backbone is derived from a hydroxy-containing polymer selected from the group consisting of polyvinyl alcohol and the polyether condensation product of a bisphenol with epichlorohydrin.

3. The method of claim 2 wherein the light-sensitive polymer is a poly(vinyl diarylcyclopropene carboxylate).

4. The method of claim 3 wherein the light-sensitive polymer is poly(vinyl 1,2-diphenylcyclopropene-3-carboxylate).

5. The method of claim 2 wherein the light-sensitive polymer comprises a side chain derived from a p-vinyl cinnamoyl chloride.

6. The method of claim 5 wherein the light-sensitive polymer is a poly{{2-{p-[2-(2-ethylhexyloxycarbonyl)vinyl]cinnamoyl-oxy}trimethylene-2,2-bis(4-oxyphenyl)propane}}.

7. The method of claim 1 wherein the sensitizing agent is a pyrylium or thiapyrylium dye salt.

8. The method of claim 7 wherein the sensitizing agent is 2,6-bis-p-ethoxyphenyl-4-p-n-amyloxyphenyl thiapyrylium perchlorate.

9. The method of claim 1 wherein the sensitizing agent is a naphthothiazoline sensitizer.

10. The method of claim 9 wherein the sensitizer is 2-benzoylmethylene-3-methyl-naphtho-[1,2-d]thiazoline.

11. The method of claim 1 wherein the light-sensitive polymer layer further contains a plasticizer.

12. The method of claim 11 wherein the plasticizer is a chlorinated biphenyl plasticizer.

13. The method of claim 1 wherein the solvent employed to remove the unexposed areas of the layer is benzyl alcohol.

14. The method of claim 1 wherein the solvent employed to remove the unexposed areas of the layer is 1,1,1-trichloroethane.

15. The method of claim 1 wherein development is in an ultrasonically agitated bath of the solvent.

16. A method of claim 1 wherein the concentration of the sensitizer dye varies through the depth of the layer, the lowest concentration being at the surface of the layer and the greatest concentration being adjacent the support.

17. A method of claim 16 wherein there is dispersed in the layer particles which scatter but do not absorb the incident radiation.

18. A method for the production of a polymeric relief image for use in the preparation of stereotype printing plates which comprises the steps of a. imagewise exposing the actinic radiation a support bearing a layer having a thickness of 5 to 50 mils of a photosensitive polymer composition comprising poly-(vinyl 1,2-diphenylcyclopropene-3-carboxylate) and 2-benzoylmethylene-3-methyl-naphtho[1,2-d]thiazoline as a sensitizer therefor, to insolubilize the polymer in exposed areas of the layer, and b. developing a relief image by immersing the layer in an ultrasonically agitated bath of benzyl alcohol to remove non-insolubilized polymer from unexposed areas of the layer.

19. A method for the production of a polymeric relief image for use in the preparation of stereotype printing plates which comprises the steps of:

a. imagewise exposing to actinic radiation a support bearing a layer having a thickness of 5 to 50 mils of a photosensitive polymer composition comprising poly-{{2-{p-[2-(2-ethylhexyloxycarbonyl)vinyl]cinnamoyloxy} trimethylene-2,2-bis(4-oxyphenyl)propane}} and 2-benxoylmethylene-3-methyl-naphtho-[1,2-d]thiazoline as a sensitizer therefor, to insolubilize the polymer in exposed areas of the layer, and b. developing a relief image by immersing the layer in an ultrasonically agitated bath of trichloroethane to remove noninsolubilized polymer from unexposed areas of the layer.

* * * * *